United States Patent
Kobori

(10) Patent No.: US 11,835,872 B2
(45) Date of Patent: Dec. 5, 2023

(54) POSITIONING APPARATUS, LITHOGRAPHY APPARATUS, AND ARTICLE MANUFACTURING METHOD

(71) Applicant: CANON KABUSHIKI KAISHA, Tokyo (JP)

(72) Inventor: Toru Kobori, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/881,948

(22) Filed: Aug. 5, 2022

(65) Prior Publication Data
US 2023/0063228 A1  Mar. 2, 2023

(30) Foreign Application Priority Data
Sep. 2, 2021 (JP) ................. 2021-143411

(51) Int. Cl.
*G03F 9/00* (2006.01)
*G03F 7/00* (2006.01)
*G03F 7/20* (2006.01)

(52) U.S. Cl.
CPC .......... *G03F 9/7042* (2013.01); *G03F 7/0002* (2013.01); *G03F 7/707* (2013.01)

(58) Field of Classification Search
None
See application file for complete search history.

(56) References Cited

U.S. PATENT DOCUMENTS 9,373,532 B2 * 6/2016 Morohashi ......... F16M 11/2092

FOREIGN PATENT DOCUMENTS

JP    H05280609 A    10/1993
JP    H0740178 A  *  2/1995  ............. B23Q 5/408

OTHER PUBLICATIONS

Machine translation of Katsura (JP H0740178 A) (Year: 1995).*

* cited by examiner

*Primary Examiner* — Robert J Grun
(74) *Attorney, Agent, or Firm* — ROSSI, KIMMS & McDOWELL LLP

(57) ABSTRACT

A positioning apparatus includes a guide, a movable member capable of moving in a first direction while being guided by the guide, and a driver configured to drive the movable member in the first direction. The driver includes a feed screw extending in the first direction, a nut configured to threadably engage with the feed screw and move in the first direction along with a rotation of the feed screw, and a connecting device configured to connect the nut and the movable member. The connecting device includes a hollow rod with one end connected to the movable member and the other end connected to the nut, and the feed screw is inserted into a hollow portion of the rod.

9 Claims, 4 Drawing Sheets

ANGULAR MISALIGNMENT MODE

ECCENTRICITY MODE

POSITIONING APPARATUS, LITHOGRAPHY APPARATUS, AND ARTICLE MANUFACTURING METHOD

BACKGROUND OF THE INVENTION

Field of the Invention

The present invention relates to a positioning apparatus, a lithography apparatus, and an article manufacturing method.

Description of the Related Art

In a positioning apparatus used in a machine tool, a measuring apparatus, a robot, a semiconductor manufacturing apparatus, or the like, a feed screw can be used to move a table. In this case, if a nut threadably engaging with the feed screw is fixed to the table, a simplest configuration can be obtained. However, the influence of bending of the feed screw is directly transmitted to the table side, resulting in a decrease of feed accuracy.

To prevent this, some positioning apparatuses use a spherical bearing interposed between a table and a nut of a feed screw instead of fixing these (for example, Japanese Patent Laid-Open No. 5-280609).

However, usage of the spherical bearing in the conventional technique cannot completely cope with misalignment between linear guides and the feed screw. For example, according to the technique disclosed in Japanese Patent Laid-Open No. 5-280609, it is possible to cope with the angular misalignment of pitching and yawing with respect to the advancing direction of the table. However, it is impossible to cope with eccentricity in the direction of the orthogonal axis to the horizontal direction with respect to the advancing direction of the table and in the direction of the orthogonal axis to the vertical direction with respect to the advancing direction of the table. Hence, for a stage that needs precise positioning required of an exposure apparatus or the like, a stop position error of nonnegligible level may occur.

SUMMARY OF THE INVENTION

The present invention provides a technique advantageous in improving positioning accuracy.

The present invention in its one aspect provides a positioning apparatus comprising a guide, a movable member capable of moving in a first direction while being guided by the guide, and a driver configured to drive the movable member in the first direction, wherein the driver includes a feed screw extending in the first direction, a nut configured to threadably engage with the feed screw and move in the first direction along with a rotation of the feed screw, and a connecting device configured to connect the nut and the movable member, wherein the connecting device includes a hollow rod with one end connected to the movable member and the other end connected to the nut, and the feed screw is inserted into a hollow portion of the rod.

Further features of the present invention will become apparent from the following description of exemplary embodiments (with reference to the attached drawings).

DESCRIPTION OF THE EMBODIMENTS

Figure 1:
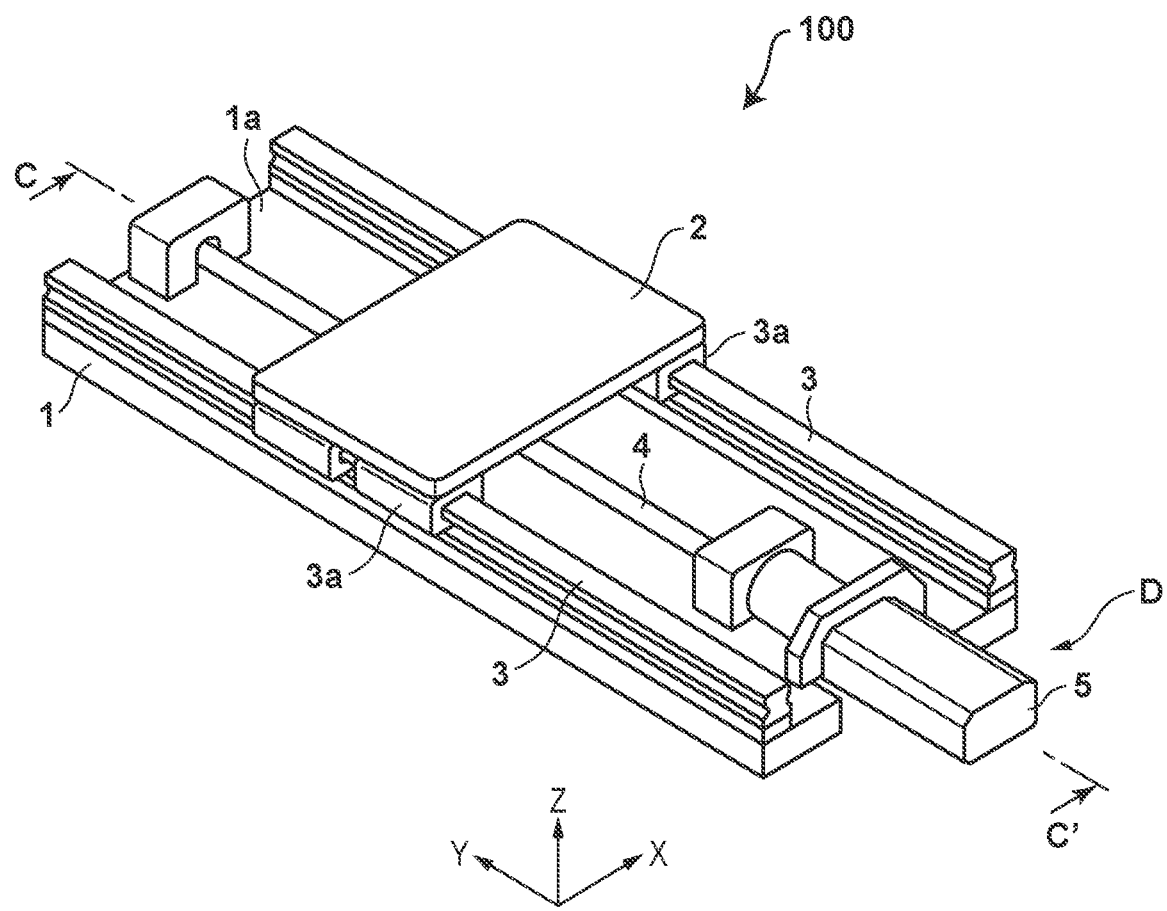
FIG. 1 is a perspective view showing the configuration of a positioning apparatus.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

Figure 2:
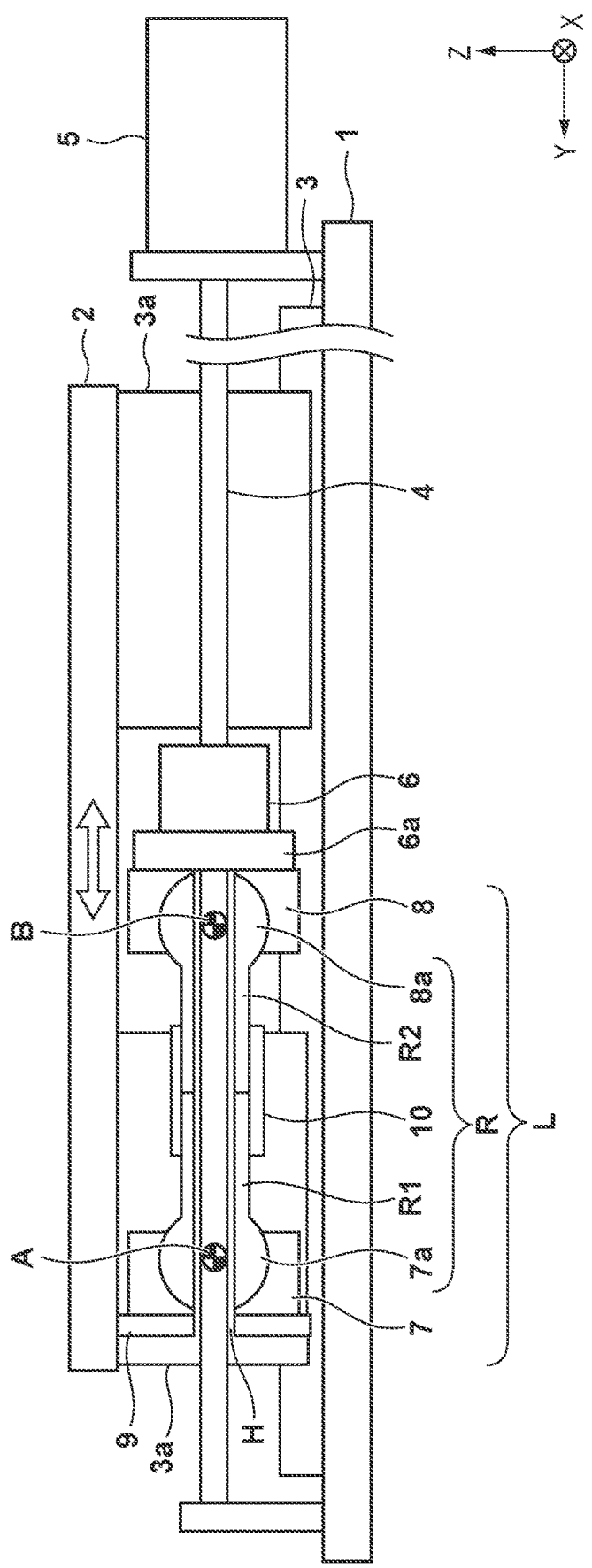
FIG. 2 is a sectional view of main part taken along a line C-C' in FIG. 1.

FIG. 1 is a perspective view showing the configuration of a positioning apparatus 100 according to the embodiment. FIG. 2 is a sectional view of main part taken along a line C-C' in FIG. 1.

The positioning apparatus 100 is configured to move a table 2 that is a movable member on an upper surface 1a of a base 1. Note that if the positioning apparatus 100 is implemented in a stage apparatus that holds a substrate and moves, as will be described later, a substrate chuck configured to hold the substrate is mounted on the table 2. The upper surface 1a of the base 1 is a surface (a surface parallel to the X-Y plane) parallel to the Y direction (first direction) and the X direction (second direction), which are orthogonal to each other. The positioning apparatus 100 can move the table 2 to an arbitrary position in the X and Y directions on the upper surface 1a of the base 1. To simplify the description, FIG. 1 shows only a configuration for moving the table 2 in the Y direction. A configuration for moving the table 2 in the X direction can be the same as the configuration for moving the table 2 in the Y direction, and a description thereof will be omitted.

The base 1 can be fixed on, for example, the floor surface in a clean room. A pair of linear guides 3 extending in the Y direction are provided on both end faces of the base 1 in the X direction. The linear guides 3 are guide members configured to guide the movement of the table 2 in the Y direction. Movable elements 3a can engage with the linear guides 3 and move on the linear guides 3. The table 2 is mounted on the movable elements 3a provided on the pair of linear guides 3.

The positioning apparatus 100 includes a driver D that drives, in the Y direction, the table 2 guided by the linear guides 3. The driver D can include a feed screw 4, a motor 5, a nut 6, and a connecting device L that connects the nut 6 and the table 2. The feed screw 4 is arranged to extend in the Y direction on the base 1 at the center in the X direction and under the table 2. Note that the feed screw 4 may be a ball screw. The nut 6 threadably engages with the feed screw 4. One end of the feed screw 4 is connected to the output shaft of the motor 5, and the feed screw 4 is rotatably driven by the motor 5. The table 2 is connected to the nut 6 via the connecting device L. Hence, when the feed screw 4 is rotatably driven, the table 2 can move in the Y direction via the nut 6.

The connecting device L can include a rod R with one end connected to the table 2 and the other end connected to the nut 6. The rod R is a rod with a through hole H (hollow portion), and the feed screw 4 is inserted into the hollow portion H. The rod R can be one rod, but may be formed by jointing a plurality of rods. In the example shown in FIG. 2, the rod R is formed by a first rod R1 and a second rod R2, and the first rod R1 and the second rod R2 are connected by a coupling 10.

In an example, one end 7a of the rod R (the distal end of the first rod R1) and the other end 8a (the distal end of the second rod R2) are each formed into a spherical shape. The connecting device L can further include a first spherical bearing 7 that swingably supports the one end 7a of the rod R with the spherical shape (the distal end of the first rod R1) and a second spherical bearing 8 that swingably supports the other end 8a of the rod R with the spherical shape (the distal end of the second rod R2). In this case, the one end 7a of the rod R with the spherical shape (the distal end of the first rod R1) is connected to the table 2 via the first spherical bearing 7. In the example shown in FIG. 2, the first spherical bearing 7 and the table 2 are connected via a connecting member 9. In addition, the other end 8a of the rod R with the spherical shape (the distal end of the second rod R2) is connected to a flange 6a of the nut 6 via the second spherical bearing 8.

A hollow portion is formed in each of the first spherical bearing 7 and the second spherical bearing 8, like the rod R. The nut 6, the rod R, the first spherical bearing 7, and the second spherical bearing 8 are arranged coaxially, and the feed screw 4 extends through the linearly aligned hollow portions.

With the above-described configuration, the nut 6, the rod R, the first spherical bearing 7, and the second spherical bearing 8 can integrally be driven by the feed screw 4 to move the table 2.

Also, the connecting device L swingably supports the rod R by the first spherical bearing 7 and the second spherical bearing 8. By the swing, the connecting device L can absorb the installation error of the driver D. To implement such installation error absorption, a predetermined clearance is provided between the feed screw 4 and the inner wall of the hollow portion through which the feed screw 4 passes. The directions of alignment errors required to be coped with in this embodiment include the following directions.

(1) A direction (X direction (second direction)) orthogonal to the feed direction (Y direction (first direction)) of the table 2 on a horizontal plane.
(2) A direction (Z direction (third direction)) orthogonal to the feed direction (Y direction) of the table 2 on a vertical plane.
(3) A rotation direction about the X-axis (the axis in the second direction) (pitching).
(4) A rotation direction about the Z-axis (the axis in the third direction) (yawing).

Hence, the predetermined clearance is set such that the feed screw 4 is swingably loosely fitted by the connecting device L concerning the directions shown in (1) to (4).

Figure 3A:
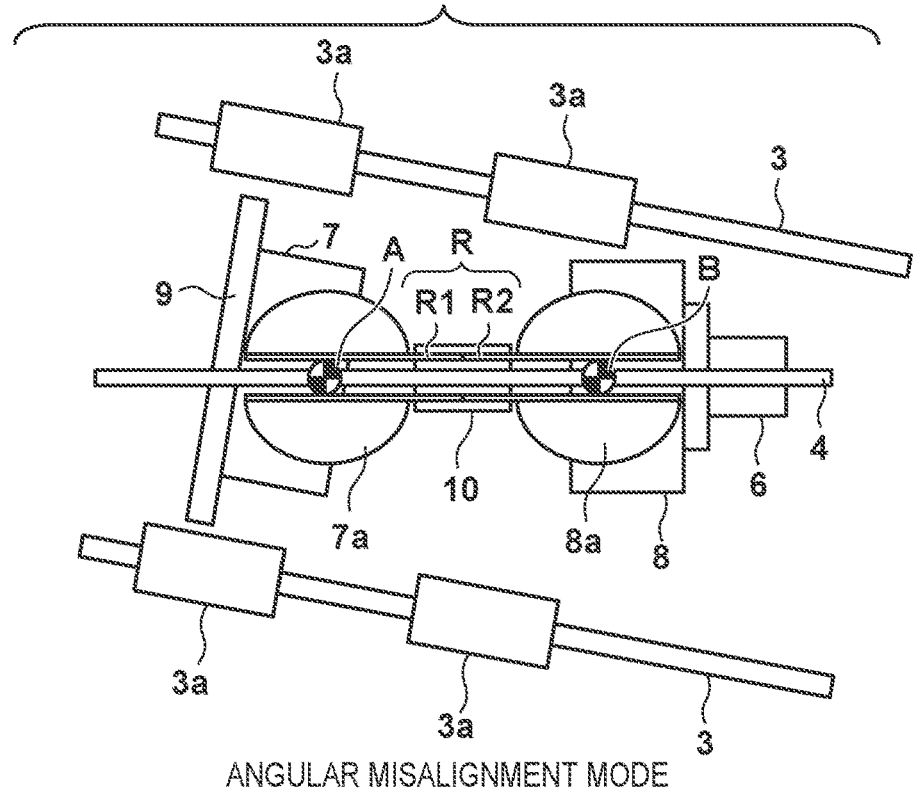
FIGS. 3A and 3B are views showing a detailed example of an installation error of a driver.
Figure 3B:
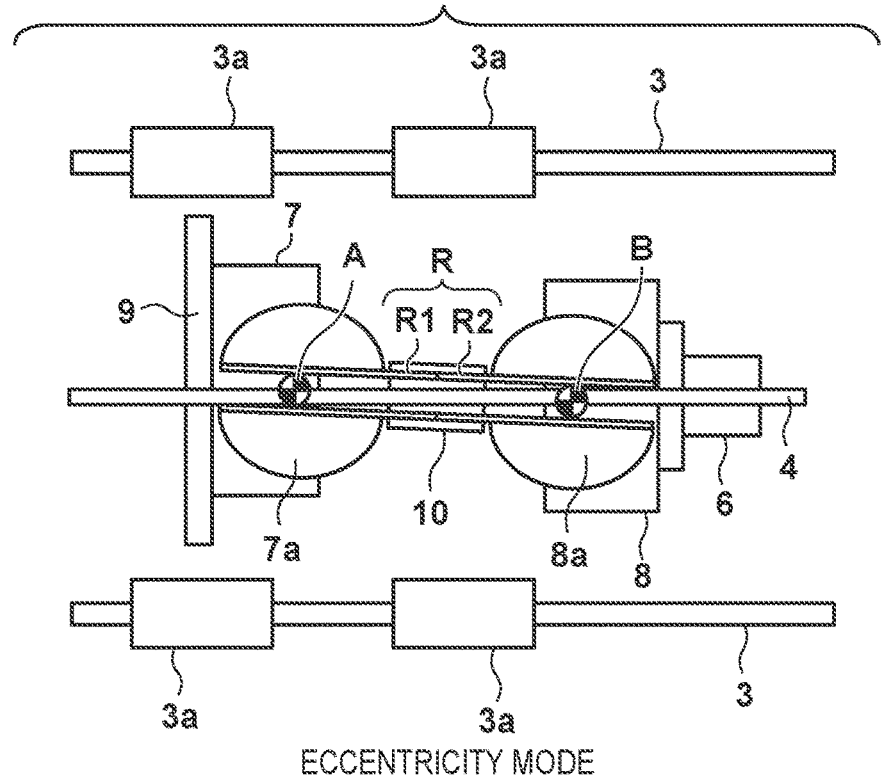

As a detailed example of the installation error of the driver D, for example, a case (angular misalignment mode) in which the linear guides 3 and the feed screw 4 are made nonparallel by pitching or yawing, as shown in FIG. 3A, can be considered. Alternatively, a case (eccentricity mode) in which a rotation center A of the first spherical bearing 7 and/or a rotation center B of the second spherical bearing 8 is deviated from the center axis of the feed screw 4 due to the connection shift between the first rod R1 and the second rod R2, as shown in FIG. 3B, can be considered. According to the connecting device L of this embodiment, even in this case, the error can be absorbed by the first spherical bearing 7 and the second spherical bearing 8 spherically swinging.

Figure 4:
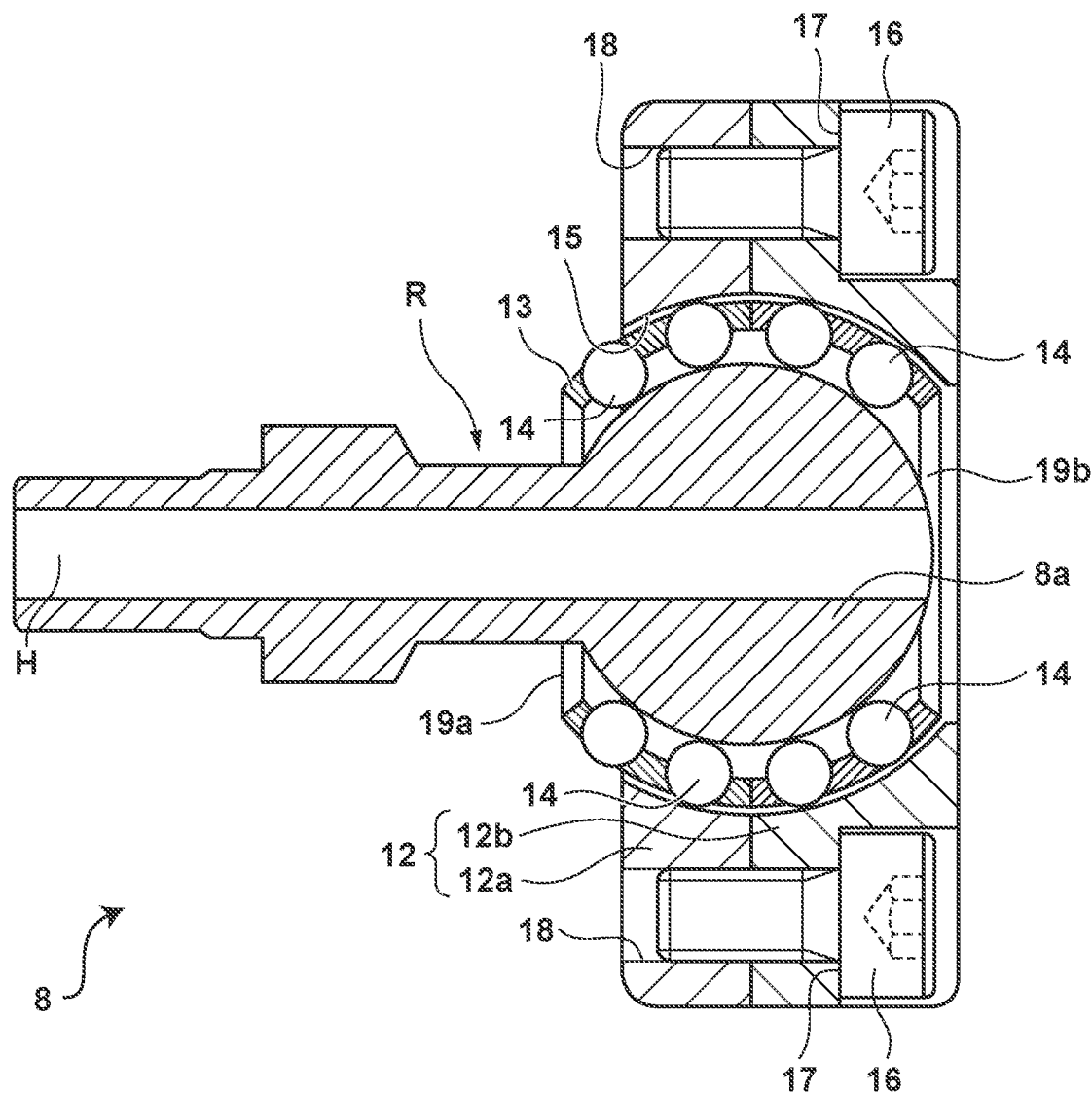
FIG. 4 is a view showing an example of the configuration of a spherical bearing.

A detailed configuration of the first spherical bearing 7 and the second spherical bearing 8 will be described next. A conventional spherical bearing has a gap inside the bearing, but neither a radial pressure nor an axial pressure can give an even pressure in the spherical vertical direction. It is therefore found that the conventional general bearing is not suitable for handling in a stage that needs precise positioning. FIG. 4 shows an example of the configuration of a spherical bearing that solves this problem. FIG. 4 representatively shows a detailed example of the configuration of the second spherical bearing 8. The first spherical bearing 7 can be configured like the second spherical bearing 8, and a description of the configuration of the first spherical bearing 7 will be omitted.

Referring to FIG. 4, the second spherical bearing 8 can include a cage assembly 13 that holds the spherical distal end portion (other end 8a) of the rod R via a plurality of steel balls 14 (spherical rolling members). Also, the second spherical bearing 8 can include an outer peripheral member 12 that surrounds and supports the cage assembly 13 to give a pressure, via the plurality of steel balls 14, to the distal end portion of the rod R held by the cage assembly 13.

The outer peripheral member 12 can be formed by a first outer peripheral member 12a and a second outer peripheral member 12b. By the first outer peripheral member 12a and the second outer peripheral member 12b, the second spherical bearing 8 holds, via the cage assembly 13, the spherical distal end portion (other end 8a) of the rod R such that it can swing within a predetermined angle range. The cage assembly 13 holds the spherical distal end portion (other end 8a) of the rod R via the plurality of steel balls 14.

The first outer peripheral member 12a and the second outer peripheral member 12b can be fixed by, for example, fastening of bolts 16. The first outer peripheral member 12a and the second outer peripheral member 12b each have an annular shape centered on the hollow shaft of the rod R (the shaft of the feed screw 4) and hold the spherical distal end portion (other end 8a) of the rod R in a constant pressure state together with the cage assembly 13 via the plurality of steel balls 14 (spherical rolling members). Spherical surface machining is performed for inside surfaces 15 of the first outer peripheral member 12a and the second outer peripheral member 12b to sandwich the cage assembly 13 in a fitted state. Also, stepped holes 17 configured to store the head and screw portions of the bolts 16 extending from one surface to the other surface are formed on both outer sides of the inside surface 15 of the second outer peripheral member 12b, and screw holes 18 are threaded in the first outer peripheral member 12a.

According to the first spherical bearing 7 and the second spherical bearing 8 as described above, it is possible to apply a pressure and eliminate a gap. Also, the spherical distal end portion (other end 8a) of the rod R is fitted in the first outer peripheral member 12a and the second outer peripheral member 12b via the plurality of steel balls 14. As described above, the first spherical bearing 7 and the second spherical bearing 8 are not so-called conventional slide bearings but rolling bearings using the steel balls 14. For this reason, even if a pressure is received, the movement is smooth.

In addition, an appropriate relationship holds between the angle from the coupling surface between the first outer peripheral member 12a and the second outer peripheral member 12b to the lower end portion of the cage assembly 13 and the opening angle from the coupling surface to the end portion of the inside surface 15 of the first outer peripheral member 12a, which is the rolling surface for the steel balls 14. This makes it possible to increase an allowable tilting angle and support the spherical distal end portion (other end 8a) of the rod R without play and falling off. Hence, the first spherical bearing 7 and the second spherical bearing 8 are bearings that can be used more suitably for a precision measuring tool, a precision working machine, a precision positioning mechanism, and the like.

In addition, the cage assembly 13 that holds the spherical distal end portion (other end 8a) of the rod R can be formed by, for example, divided members divided in parallel to a receiving opening surface 19a and an opening surface 19b. This configuration is simple and perfect in terms of strength, and can simplify the assembly process.

<Application Example>

An application example of the positioning apparatus according to the above-described embodiment will be described. The above-described positioning apparatus is useful in positioning a target in various kinds of apparatuses, for example, a robot or a machine or apparatus (industrial machine or apparatus) concerning transportation, machining, processing, measurement, or manufacturing. For example, the above-described positioning apparatus is useful in positioning a stage in a stage (X-Y stage) apparatus provided in a lithography apparatus (exposure apparatus or the like) serving as an industrial machine.

A lithography apparatus is an apparatus for forming a pattern on a substrate and can be embodied as, for example, an exposure apparatus, a drawing apparatus, or an imprint apparatus. An exposure apparatus forms a (latent image) pattern on (a resist on) a substrate using, for example, (extreme) ultraviolet light. A drawing apparatus forms a (latent image) pattern on (a resist on) a substrate using, for example, charged particle beams (electron beams or the like). An imprint apparatus forms a pattern on a substrate by molding an imprint material on the substrate. The stage apparatus can include the above-described positioning apparatus to position a stage that holds a substrate and moves.

<Embodiment of Article Manufacturing Method>

An article manufacturing method according to the embodiment of the present invention is suitable for manufacturing an article, for example, a microdevice such as a semiconductor device or an element having a fine structure. The article manufacturing method according to this embodiment includes a step of transferring the pattern of an original onto a substrate using the above-described lithography apparatus (an exposure apparatus, an imprint apparatus, a drawing apparatus, or the like), and a step of processing the substrate to which the pattern is transferred in the above step. The manufacturing method also includes other known processes (for example, oxidation, deposition, vapor deposition, doping, planarization, etching, resist removal, dicing, bonding, and packaging). The article manufacturing method according to this embodiment is advantageous in at least one of the performance, quality, productivity, and production cost of the article, as compared to conventional methods.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-143411, filed Sep. 2, 2021, which is hereby incorporated by reference herein in its entirety.

What is claimed is:

1. A positioning apparatus comprising:
   a guide;
   a movable member movable in a first direction while being guided by the guide; and
   a driver configured to drive the movable member in the first direction, and including:
      a feed screw extending in the first direction;
      a nut configured to threadably engage with the feed screw and move in the first direction along with a rotation of the feed screw; and
      a connecting device configured to connect the nut and the movable member, and including a hollow rod with one end connected to the movable member and another end connected to the nut,
   wherein the feed screw extends into a hollow portion of the hollow rod, and
   wherein a clearance is provided between the feed screw and the hollow portion to allow the feed screw to swing in the hollow portion.

2. The apparatus according to claim 1, wherein:
   the one end and the another end of the hollow rod are each formed into a spherical shape,
   the connecting device further includes:
      a first spherical bearing configured to swingably support the one end of the hollow rod with the spherical shape; and
      a second spherical bearing configured to swingably support the other end of the hollow rod with the spherical shape, and
   the one end of the hollow rod is connected to the movable member via the first spherical bearing, and the another end of the hollow rod is connected to the nut via the second spherical bearing.

3. The apparatus according to claim 2, wherein:
   a hollow portion is formed in each of the first spherical bearing and the second spherical bearing, and
   the nut, the hollow rod, the first spherical bearing, and the second spherical bearing are arranged coaxially, and the feed screw extends through the hollow portions thereof.

4. The apparatus according to claim 3, wherein the clearance is also provided between the feed screw and the hollow portions of the first and second spherical bearings and is set so that the feed screw is swingably loosely fitted by the connecting device concerning a second direction orthogonal to the first direction on a horizontal plane, a third direction orthogonal to the first direction on a vertical plane, a rotation direction about an axis in the second direction, and a rotation direction about an axis in the third direction.

5. The apparatus according to claim 3, wherein:
   the hollow rod includes a first hollow rod and a second hollow rod,
   the first hollow rod and the second hollow rod are connected by a coupling, and
   the clearance is also provided between the feed screw and the hollow portions of the first and second spherical bearings and is set so that the feed screw is swingably loosely fitted by the connecting device even in a state where a shift occurs in connection between the first hollow rod and the second hollow rod.

6. The apparatus according to claim 2, wherein each of the first spherical bearing and the second spherical bearing includes:
   a cage assembly configured to hold a spherical distal end portion of the hollow rod via a plurality of spherical rolling members; and
   an outer peripheral member configured to surround and support the cage assembly to give a pressure, via the plurality of spherical rolling members, to the distal end portion held by the cage assembly.

7. A lithography apparatus comprising:
a positioning apparatus; and
a substrate chuck mounted on a movable member of the positioning apparatus,
wherein the lithography apparatus is configured to transfer a pattern of an original to a substrate held by the substrate chuck, and
wherein the positioning apparatus comprises:
   a guide;
   a movable member movable in a first direction while being guided by the guide; and
   a driver configured to drive the movable member in the first direction, and including:
      a feed screw extending in the first direction;
      a nut configured to threadably engage with the feed screw and move in the first direction along with a rotation of the feed screw; and
      a connecting device configured to connect the nut and the movable member, and including a hollow rod with one end connected to the movable member and another end connected to the nut,
   wherein the feed screw extends into a hollow portion of the hollow rod, and
   wherein a clearance is provided between the feed screw and the hollow portion to allow the feed screw to swing in the hollow portion.

8. The apparatus according to claim 7, wherein the lithography apparatus is formed as one of an exposure apparatus or an imprint apparatus.

9. An article manufacturing method comprising:
transferring a pattern to a substrate using a lithography apparatus; and
processing the substrate with the transferred pattern,
wherein an article is manufactured from the processed substrate, and
wherein the lithography apparatus comprises:
   a positioning apparatus; and
   a substrate chuck mounted on a movable member of the positioning apparatus,
   wherein the lithography apparatus is configured to transfer a pattern of an original to a substrate held by the substrate chuck, and
   wherein the positioning apparatus comprises:
      a guide;
      a movable member movable in a first direction while being guided by the guide; and
      a driver configured to drive the movable member in the first direction, and including:
         a feed screw extending in the first direction;
         a nut configured to threadably engage with the feed screw and move in the first direction along with a rotation of the feed screw; and
         a connecting device configured to connect the nut and the movable member, and including a hollow rod with one end connected to the movable member and another end connected to the nut,
      wherein the feed screw extends into a hollow portion of the hollow rod, and
      wherein a clearance is provided between the feed screw and the hollow portion to allow the feed screw to swing in the hollow portion.

* * * * *